(12) United States Patent
Wormsbecher et al.

(10) Patent No.: US 7,654,844 B1
(45) Date of Patent: Feb. 2, 2010

(54) TELESCOPIC POWER CONNECTOR (75) Inventors: Paul Andrew Wormsbecher, Apex, NC (US); Michael Sven Miller, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/196,334

(22) Filed: Aug. 22, 2008

(51) Int. Cl.
*H01R 13/15* (2006.01)
(52) U.S. Cl. ..................... 439/259; 361/727
(58) Field of Classification Search ............ 439/259, 439/261, 310, 924.1, 928.1; 361/727
See application file for complete search history.

(56) References Cited

U.S. PATENT DOCUMENTS

| | | | |
|---|---|---|---|
| 3,977,748 A | 8/1976 | Gruhn et al. | |
| 4,701,134 A | 10/1987 | Jones | |
| 5,010,426 A * | 4/1991 | Krenz | 360/97.01 |
| 5,317,481 A * | 5/1994 | Hillis et al. | 361/796 |
| 5,415,559 A * | 5/1995 | Ichimura | 439/259 |
| 5,441,416 A | 8/1995 | Gajewski et al. | |
| 6,386,887 B2 | 5/2002 | Boiret et al. | |
| 6,411,517 B1 * | 6/2002 | Babin | 361/759 |
| 6,431,894 B1 | 8/2002 | Boiret et al. | |
| 6,816,388 B2 * | 11/2004 | Junkins et al. | 361/801 |
| 6,884,952 B2 | 4/2005 | Mauroux et al. | |
| 6,926,548 B2 * | 8/2005 | Reasoner et al. | 439/310 |
| 7,265,968 B2 * | 9/2007 | Champion et al. | 361/679.01 |
| 7,364,452 B2 * | 4/2008 | Carver et al. | 439/310 |
| 2005/0085132 A1 | 4/2005 | Chai et al. | |

* cited by examiner

*Primary Examiner*—Thanh-Tam T Le
(74) *Attorney, Agent, or Firm*—Cynthia G. Seal; Jeffrey L. Streets (57) ABSTRACT

A power supply module configured for removable insertion into a power supply bay of an electronic system. A telescopic power connector disposed within the power supply housing includes a plurality of internal fixed contacts in electrical communication with an electrical socket and a movable member carrying a plurality of elongate sliding contacts in sliding contact with the internal fixed contacts. The movable member is movable generally perpendicular to an insertion direction of the power supply housing. A mechanical actuator is configured for moving the movable member of the telescopic power connector into connection with an external power connector, such as on a motherboard, so that ends of the sliding contacts are moved into electrical connection with terminals on the external power connector while remaining in sliding contact with the internal fixed contacts.

15 Claims, 6 Drawing Sheets

FIG. 9

TELESCOPIC POWER CONNECTOR

BACKGROUND OF THE INVENTION

1. Field of the Invention

The present invention relates to modular components including mechanisms for removably connecting a power supply to an electronic component, such as the main circuit board of a computer system.

2. Background of the Related Art

Computer systems often have a modular configuration including standardized units or dimensions and using interchangeable components to provide flexibility in system configurations. For example, rack-mountable servers may be designed with industry-standard dimensions and connections for fitting within server bays having corresponding dimensions and connections in a rack. This allows a customized system to be assembled from a selected assortment of servers and other rack-mount equipment to achieve a system having a particular set of capabilities. Likewise, components of rack-mount servers or server systems may include interchangeable modular components, such as modular power supplies that may be removed and replaced.

The connection between a modular power supply and a server system is different than other connections in the server system, such as the connection between a motherboard and an expansion card. Some modular power supplies provide electrical power to the server system over a number of rails at different standard voltages, such as 12V, 5V, 3.3V and ground. Furthermore, certain power supplies may provide multiple rails at the same voltage in order to meet the electrical requirements of the components in the server system.

BRIEF SUMMARY OF THE INVENTION

One embodiment of the present invention provides a power supply module including a power supply housing configured for removable insertion into a power supply bay of an electronic system. A telescopic power connector is disposed within the power supply housing. The telescopic power connector includes a plurality of internal fixed contacts in electrical communication with an electrical socket and a movable member carrying a plurality of elongate sliding contacts in sliding contact with the internal fixed contacts. The movable member is movable generally perpendicular to an insertion direction of the power supply housing. A mechanical actuator is configured for moving the movable member of the telescopic power connector into connection with a fixed system power connector, such that ends of the sliding contacts are moved into electrical connection with terminals on the fixed system power connector while remaining in sliding contact with the internal fixed contacts.

Another embodiment provides a computer system. A computer chassis of the computer system includes a power supply bay. A circuit board in the computer chassis has a fixed system power connector secured to the circuit board adjacent to the power supply bay. A power supply module is removably insertable in the power supply bay. The power supply module includes a telescopic power connector including a plurality of internal fixed contacts in electrical communication with an electrical socket and a movable member carrying a plurality of elongate sliding contacts in sliding contact with the internal fixed contacts. The movable member is movable generally perpendicular to an insertion direction of the power supply module. A mechanical actuator is configured for moving the movable member of the telescopic power connector into connection with the external power connector, such that ends of the sliding contacts are moved into electrical connection with terminals on the external power connector while remaining in sliding contact with the internal fixed contacts.

DETAILED DESCRIPTION OF THE INVENTION

The present invention provides a modular power supply for an electronic system, such as a rack-mountable server. The power supply module has a telescopic power connector for selectively connecting and disconnecting the power supply module with the electronic system. The power supply module may be inserted into a power supply bay provided at the rear of the electronic system in an insertion direction that is generally parallel to a fixed connector, such as on a motherboard. The telescopic connector includes fixed contacts internal to the power supply (i.e., "internal fixed contacts") electrically coupled to an electrical socket that receives a power cord. The telescopic power connector also includes a movable member that carries a plurality of sliding contacts in sliding contact with the internal fixed contacts.

Various embodiments of a modular power supply and optional configurations thereof are presented below. In one embodiment, the internal fixed contacts are rails extending from a fixed header and the sliding contacts are a pair of opposing contacts disposed in passageways that receive the rails. In an alternative configuration, the internal fixed contacts are a pair of opposing contacts on a fixed receptacle inside the housing, and the sliding contacts are movable rails received by the contacts. A mechanical actuator may be provided to move the telescopic power connector in a direction essentially perpendicular to the insertion direction, into connection with a fixed system power connector on the motherboard. As a result, the sliding contacts carried on the movable member are brought into contact with terminals of the fixed system power connector on the motherboard. The power supply module may therefore transfer the electrical power through the telescopic power connector to the motherboard.

Figure 1:
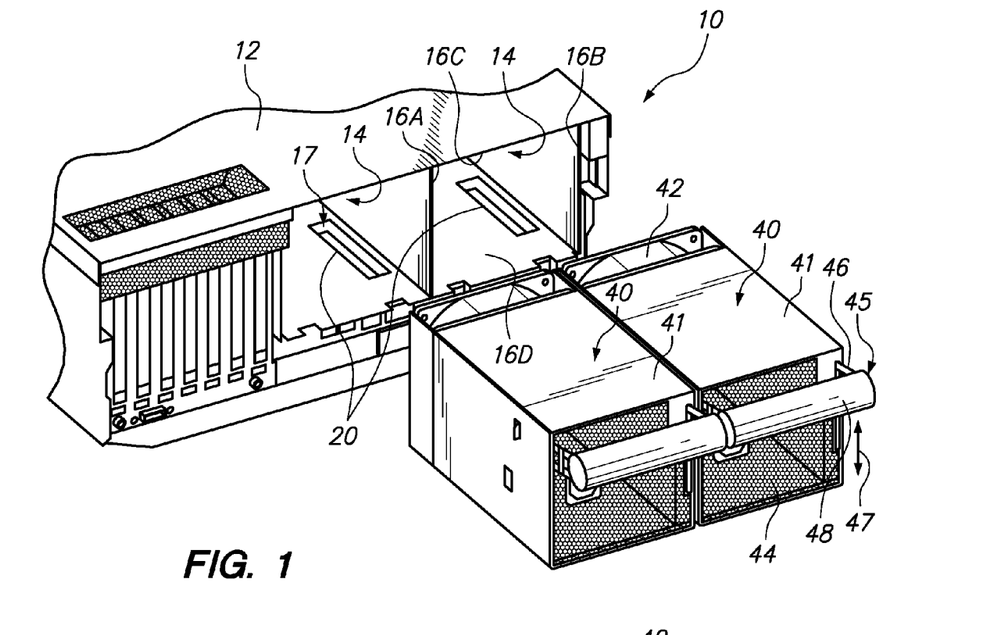
FIG. 1 is a perspective, partial-assembly view of a rack-mountable server with two power supply modules being inserted into respective power supply bays of a server chassis.

FIG. 1 is a perspective, partial-assembly view of a rack-mountable computer system (in this embodiment, the "server") 10, with two power supply modules 40 having housing 41 that may be inserted into respective power supply bays 14 of a server chassis 12. The chassis 12 has a structural framework that includes walls 16A, 16B, 16C, 16D that define each of the power supply bays 14. The chassis 12 and walls 16A-D may be formed, for example, from sheet metal using known sheet-metal forming techniques, from molded plastic, or from other materials. A circuit board (embodied in FIG. 3 as a motherboard 24) is positioned beneath the wall 16D from the power supply bays 14. The wall 16D includes a window 17 aligned with a fixed system power connector 20 on the motherboard 24, which is external to the power supply module 40 but internal to the server 10. The power connector 20 in this embodiment is fixed to the motherboard 24 within the server 10, and may be referred to as the "fixed system power connector" 20. The walls 16A-D of the power supply bays 14 fit closely with the modules 40 to guide insertion of the modules 40 into the power supply bays 14, to constrain lateral movement of the power supply modules 40 once inserted, and to position the inserted power supply modules 40 at specific locations with respect to the fixed system power connector 20, so that the power supply modules can be connected to the fixed system power connector 20, as further detailed below. The power supply bays in alternative embodiments may include a different number of walls or alternative structural members, such as guide rails, for guiding insertion and removal of the power supply modules, for constraining movement of the inserted power supply modules, and for positioning the power supply modules with respect to the fixed system power connectors on the circuit board.

Each power supply module 40 includes an on-board cooling fan 42 for generating airflow through the power supply module 40 to cool internal components of the power supply module 40. A grill 44 at the rear of each power supply module 40 provides a physical barrier to protect the internal components of the power supply module 40, while allowing the airflow to pass through the module 40. A mechanical actuator generally indicated at 45 includes a lever 46 pivotably secured to each power supply module and an external handle 48 at the end of the lever 46. The lever 46 is shown in an upwardly-pivoted position, with the handle 48 in a corresponding "UP" position relative to the illustrated orientation of the power supply module 40. The lever pivots about an internal pivot mechanism, and can be moved alternately down and back up by hand in the direction indicated at 47.

Figure 2:
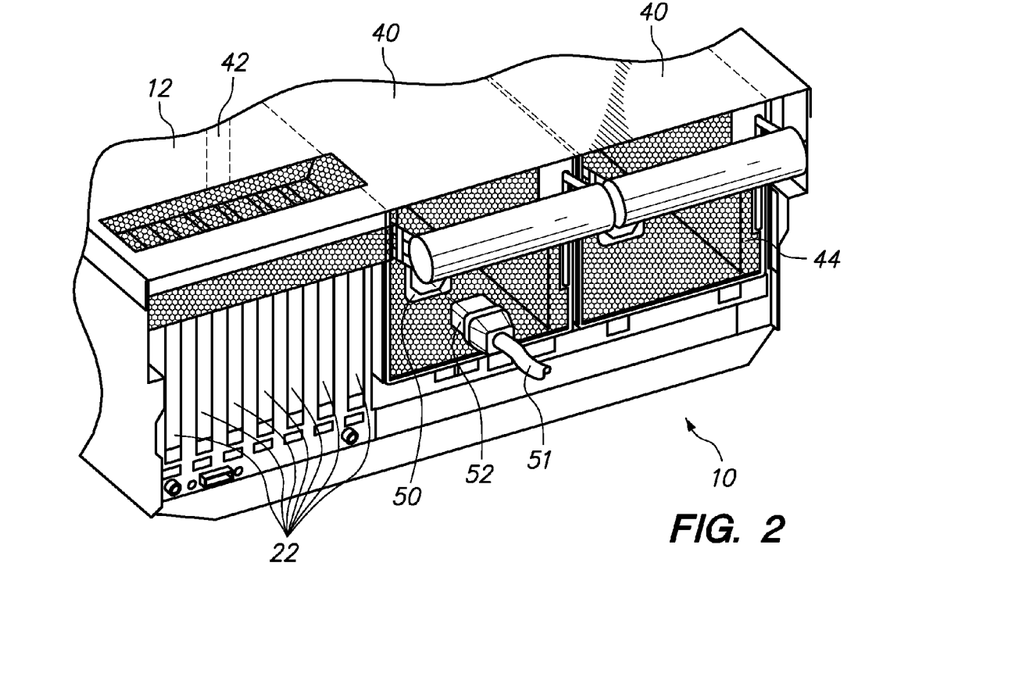
FIG. 2 is a perspective view of the server with the two power supply modules inserted into the chassis.

FIG. 2 is a perspective view of the server 10 with the two power supply modules 40 inserted into the chassis 12. The grill 44 is generally flush with the rear of the chassis 12. The fans 42 may generate sufficient airflow to also cool other components of the server 10 upstream from the power supply modules 40. An electrical socket 50 is provided on each power supply module 40 to receive electrical power from an electrical power cord 51. The power cord 51 has a plug 52 that connects to the electrical socket 50. The power cord 51 typically provides electrical power from a power source in the form of alternating current (AC). The AC power may be converted to direct current (DC) power by the power supply module 40 and provided to system components through internal electrical pathways, such as electrical components on or in communication with the motherboard 24. For example, adjacent to the power supply modules 40 are seven exemplary card slots 22, for receiving up to seven expansion cards. The power supply modules 40 may provide DC power to the application cards and other internal server components as well as the motherboard.

Figure 3:
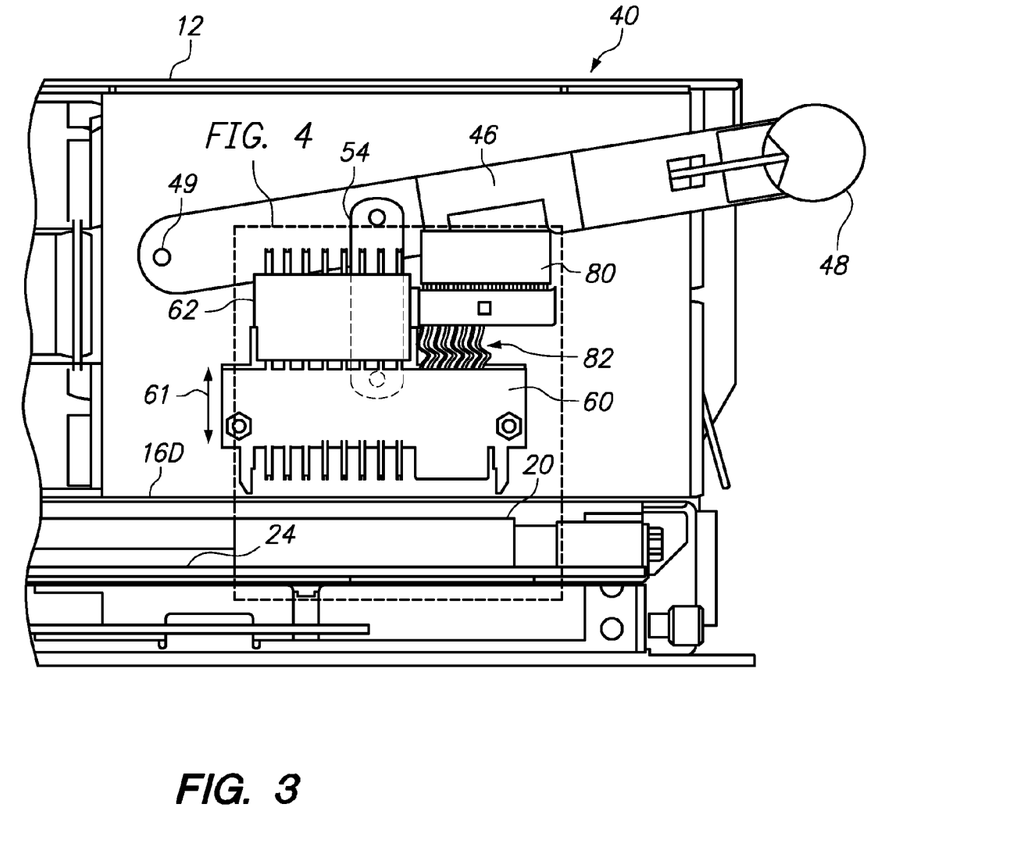
FIG. 3 is an internal side view of one of the power supply modules inserted into the server chassis, with the power supply module disconnected from the motherboard.
Figure 4:
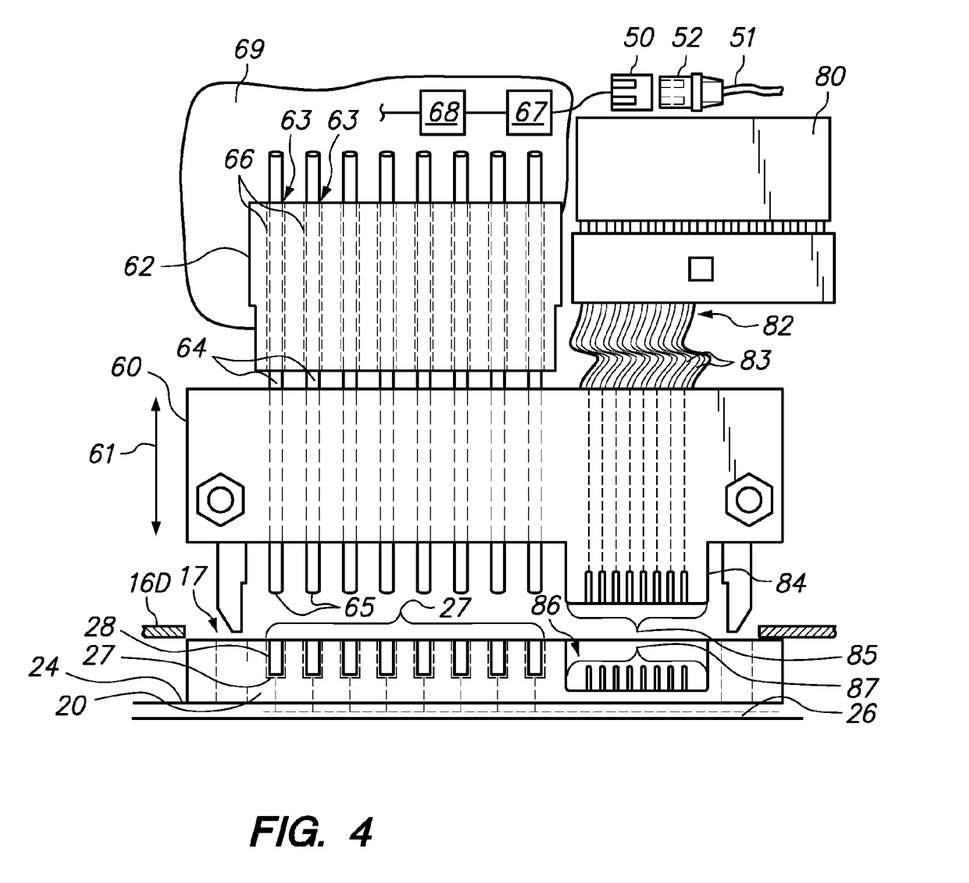
FIG. 4 is a detailed side view of a portion of the power supply module 40 further illustrating the configuration of the telescopic power connector of FIG. 3.
Figure 5:
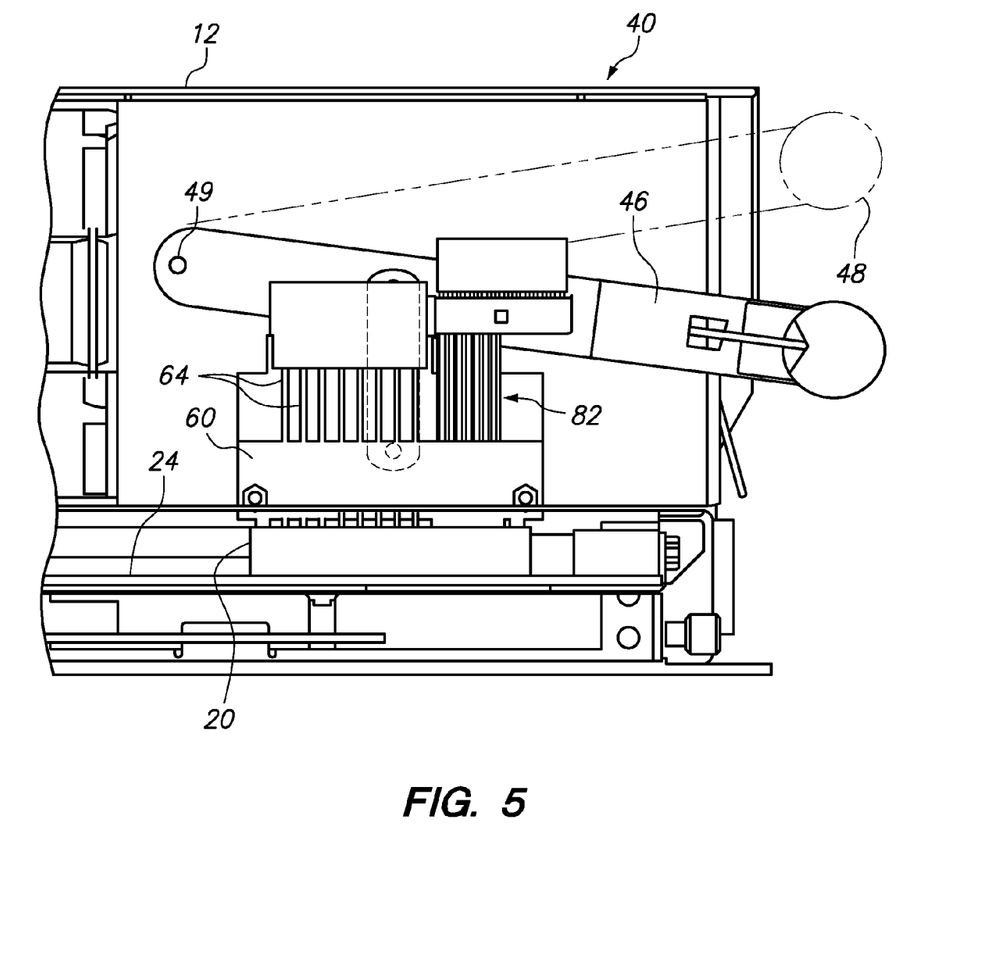
FIG. 5 is another internal side view of the power supply module of FIG. 3, with the power supply module connected to the motherboard.

FIGS. 3-5 are directed to an embodiment of the modular power supply 40 having a particular configuration of a telescopic power connector and mechanical actuator for operating the telescopic power connector. FIG. 3 is an internal side view of one of the power supply modules 40 inserted into the server chassis 12 in an insertion direction parallel to the motherboard 24. The motherboard 24 is positioned opposite the wall 16D from the power supply bays 14. A telescopic power connector includes a movable member 60 movably supported within the power supply module 40, such as on a track. The movable member is constrained to move linearly along a direction indicated at 61 that is generally perpendicular to the motherboard 24. The mechanical actuator for moving the movable member 60 includes a lever 46 pivotably coupled to the power supply module 40 about a pivot point 49. The lever 46 is coupled to the movable member 60 by a linkage 54, so that pivoting the lever 46 up and down about the pivot point 49 moves the movable member 60 along the direction 61. The lever 46 is in an upwardly-pivoted position that corresponds to the handle 48 being in the UP position. The movable member 60 and fixed system power connector 20 are configured to mate with each other so that the motherboard 24 can receive power from the power supply module 40. With the lever 46 in the upwardly-pivoted position, the movable member 60 is separated from and accordingly electrically disconnected from the fixed system power connector 20 on the motherboard 24.

A fixed receptacle 62 is secured within the power supply module 40 in a fixed position with respect to the power supply module 40. The fixed receptacle 62 may be structurally secured to the power supply module 40 directly or by an intermediate supporting structure. The fixed receptacle 62 includes a plurality of internal fixed contacts that receive electrical power from the electrical socket 50, as will be further described in relation to FIG. 4. Next to the fixed receptacle 62 is a first signal connector 80, secured in a fixed position to the power supply module 40. While the fixed receptacle 62 carries primarily electrical power, the first signal connector 80 carries primarily digital data signals and optionally provides auxiliary power connections having low voltage and power relative to the power to be carried by the fixed receptacle 62. The first signal connector 80 communicates with a power management controller over a power management bus including a flex cable, and also communicates through a flexible signal harness 82 to the movable member 60. When the movable member 60 is in a raised position, as shown, some slack is present in the flexible signal harness 82. The signal harness 82 may easily flex or buckle outward as a result of the slack. Lowering the handle 48 lowers the movable member 60 away from the first signal connector 80, thus taking up some of the slack in the signal harness 82.

FIG. 4 is a detailed view of a portion of the power supply module 40 further illustrating the configuration of the telescopic power connector of FIG. 3. A plurality of elongate, electrically-conductive rails 64, each arranged in parallel and oriented in the direction of movement indicated at 61, are carried on the movable member 60. The fixed receptacle 62 includes eight passageways 63 with electrically-conductive, opposing, fixed contacts 66 within each of the passageways 63. The pair of internal fixed contacts 66 are spaced apart and are electrically insulated from other pairs of contacts 66 by the material (e.g. plastic) of the fixed receptacle 62. Each pair of internal fixed contacts 66 receives a corresponding one of the rails 64. Accordingly, each rail 64 is in sliding contact with a corresponding pair of internal fixed contacts 66. Therefore, the rails 64 in this configuration may be referred to as the "sliding contacts." As the movable member 60 moves up and down, the rails 64 move with the movable member 60, and remain in sliding contact with the internal fixed contacts 66.

The internal fixed contacts 66 are electrically energized by the electrical socket 50. Power from the electrical socket 50 may be transformed into a form more easily used by the computer. For example, an intermediate rectifier 67 to convert AC to DC and/or a voltage regulator 68 may be provided, to provide electrical current having the characteristic (a particular set of voltages, current, etc.) that components of the computer are designed to use. The output of the rectifier 67, voltage regulator 68, or other intermediate device may be coupled to the sliding contacts 66 via electrical traces on a PCB 69. Each fixed contact 66 conducts electrical power to the rails 64.

The fixed connector 20 on the motherboard 24 has eight openings 27 corresponding to the eight rails 64. A female terminal 28 is provided in each opening 27, aligned with the corresponding rails 64. The female terminals 28 are in electrical contact with a network of electrical paths 26 on the motherboard 24. The electrical paths 26 typically include traces etched on the motherboard 24. The handle 48 may be lowered by hand, which pivots the lever 46 downward and moves the movable member 60 into connection with the fixed connector 20 on the motherboard 24. Connecting the movable member 60 with the fixed system power connector 20 places the lower ends 65 of the rails 64 into the corresponding openings 27 of the fixed system power connector 20 in contact with the respective female terminals 28. Thus, connecting the movable member 60 in the power supply module 40 with the fixed system power connector 20 on the motherboard 24 completes electrical circuit paths from the AC socket 50 of FIG. 2 to the motherboard 24.

Data signals may also be carried by the flexible harness 72, which, in this embodiment, has eight flexible wires 83 for carrying electrical signals from the first signal connector 80 to the second signal connector 84. The flexible wires 83 terminate at eight respective terminals 85 on the second signal connector 84. The fixed system power connector 20 on the motherboard 24 includes a third signal connector 86 that is configured to mate with the second signal connector 84. The third signal connector 86 has eight pins 87 corresponding to the eight terminals 85 on the second signal connector 84. When the movable member 60 is moved downward to connect to the fixed system power connector 20, the eight terminals 85 will electrically contact the eight pins 87, to complete eight signal paths from the first signal connector 80 to the motherboard 24. Thus, while the electrical pathways provided along the eight rails 64 carry primarily electrical power, the electrical pathways provided along the eight flexible wires 83 carry primarily data signals. These data signals instruct the power management controller how to operate.

Data signals may be carried along much smaller-gage-wires than power signals, which enable the use of the flexible harness 82 to carry data signals. The wires 83 on the flexible harness 82 are thin compared to the rails 64, and are thin enough to flex repeatedly in response to movement of the power connector 60. By comparison, the rails 64 are made stouter and more rigid to carry the higher-voltage electrical power. However, one skilled in the art having the benefit of this disclosure will appreciate that, aside from potentially increased cost, it would be possible to implement an analogous system of rails and sliding contacts to carry the data signals, in lieu of the flexible harness 82.

FIG. 5 is another internal side view of the power supply module 40 of FIG. 3, with the power supply module 40 connected to the motherboard 24. The lever 46 is moved to a downwardly pivoted position about the pivot point 49, in response to lowering the handle 48 by hand to a "DOWN" position. Moving the handle 48 to the DOWN position moves the movable member 60 into connection with the fixed system power connector 20, in a direction substantially perpendicular to the motherboard 24, which is also substantially perpendicular to the direction in which the power supply module 40 was inserted into the chassis 12. Power and signal communication is thereby enabled with power being carried to the motherboard 24 along the rails 64 and data signals being carried to the motherboard 24 primarily along the flexible harness 82. To subsequently disconnect the power supply module 40 from the motherboard 24, the handle 48 may be moved by hand back to the UP position, to separate the movable member 60 from the fixed system power connector 20. After disconnecting the power supply module 40 from the motherboard 24, the power supply module 40 may be slid out of the chassis 12. For example, the power supply module 40 may be removed and replaced with another power supply module having a different power rating, or the power supply module 40 may be removed and replaced with another power supply module of an equal power rating if the original power supply module 40 is defective or has exceeded its service life.

Figures 6, 7:
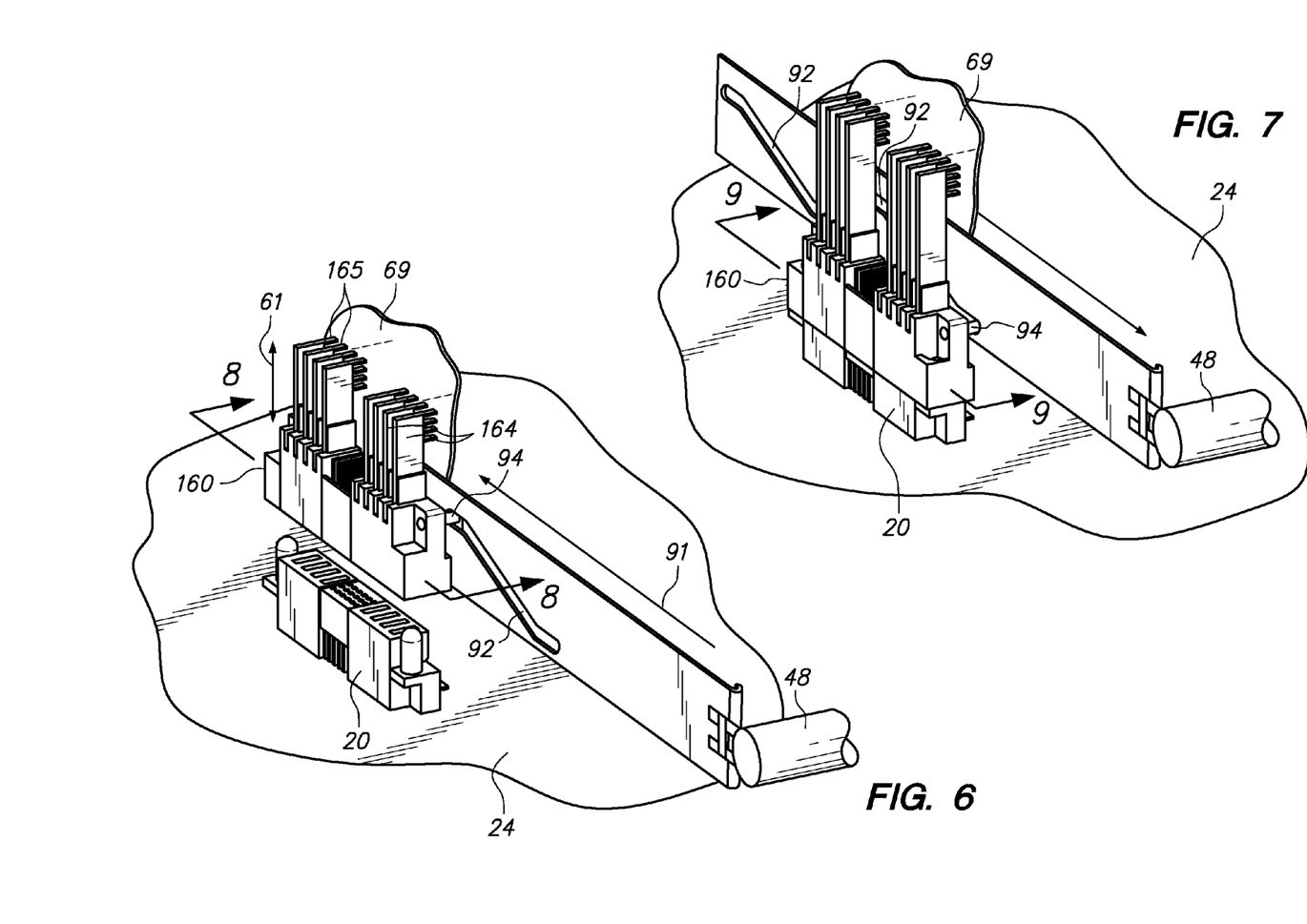
FIG. 6 is a perspective view of an alternative embodiment of a telescopic power connector having a movable member that rides along a plurality of parallel, fixed rails and is movable by a slider plate.
FIG. 7 is a perspective view of the telescopic power connector of FIG. 6, wherein the slider plate has been positioned to connect the movable member with the fixed connector.

FIG. 6 is a perspective view of an alternative embodiment of a telescopic power connector having a movable member 160 that rides along a plurality of parallel, fixed rails 164. The movable member 160 is moved by a slider plate 90. The slider plate 90 is movably supported on the power supply module and is constrained to move in a direction parallel to the motherboard 24, as indicated at 91. The slider plate 90 includes a pair of slots 92 that are angled with respect to the motherboard 24. Fasteners 94 couple the movable member 160 to the slider plate 90 by passing through the movable member 160 and riding in the slots 92. Suitable fasteners may include, for example, bolts, screws, pins, or rivets. As the slider plate 90 is moved along directional path 91, the fasteners 94 move along the angled portion of the slots 92, which moves the movable member 160 up or down, i.e. along directional path 61. In particular, moving the slider plate 90 to the left will move the movable member 160 down, and moving the slider plate 90 back to the right will move the movable member 160 up. The rails 164 in this embodiment are fixed, and terminate in leads 165 which may be soldered to the PCB 69 to receive electrical power. The movable member slides along the fixed rails 164 as the movable member 160 is raised and lowered. In FIG. 6, the slider plate 90 is positioned outward, to the right, which separates the movable member 60 from the fixed system power connector 20 on the motherboard 24 such that the power supply module 40 is electrically disconnected from the motherboard 24.

FIG. 7 is a perspective view of the telescopic power connector of FIG. 6, wherein the movable member 160 has been moved downward by the slider plate 90 into connection with the fixed connector 20 on the motherboard 24. The slider plate 90 has been moved to the left, which may be accomplished by pushing the handle 48 by hand from its position in FIG. 6. Moving the slider plate 90 inward causes the fasteners 94 to ride downward along the angled slots 92, urging the movable member 160 into connection with the fixed system power connector 20. With the movable member 160 connected to the fixed system power connector 20, the power supply module may now supply electrical power and data signals to the motherboard 24, as discussed above. To subsequently disconnect the power supply module 40 from the motherboard 24, the handle 48 may be moved by hand back outward to the position of FIG. 6, to separate the movable member 160 from the first system power connector 20. After disconnecting the power supply module 40 from the motherboard 24, the power supply module may be slid out of the chassis 12, if desired.

Figure 8:
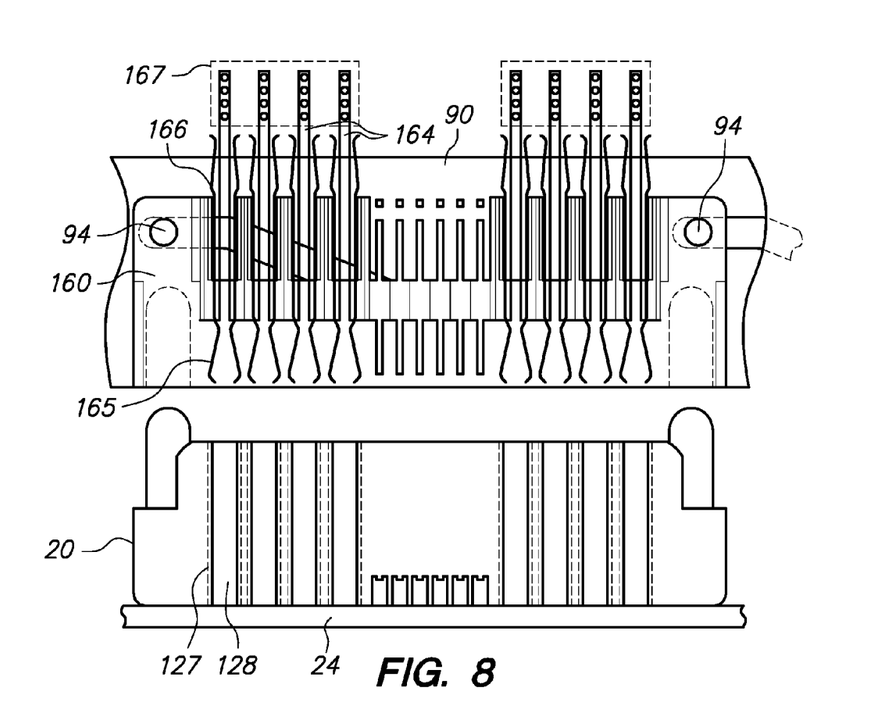
FIG. 8 is a cross-sectional view of the slider plate with the movable member separated from the fixed system power connector, as in FIG. 6.
Figure 9:
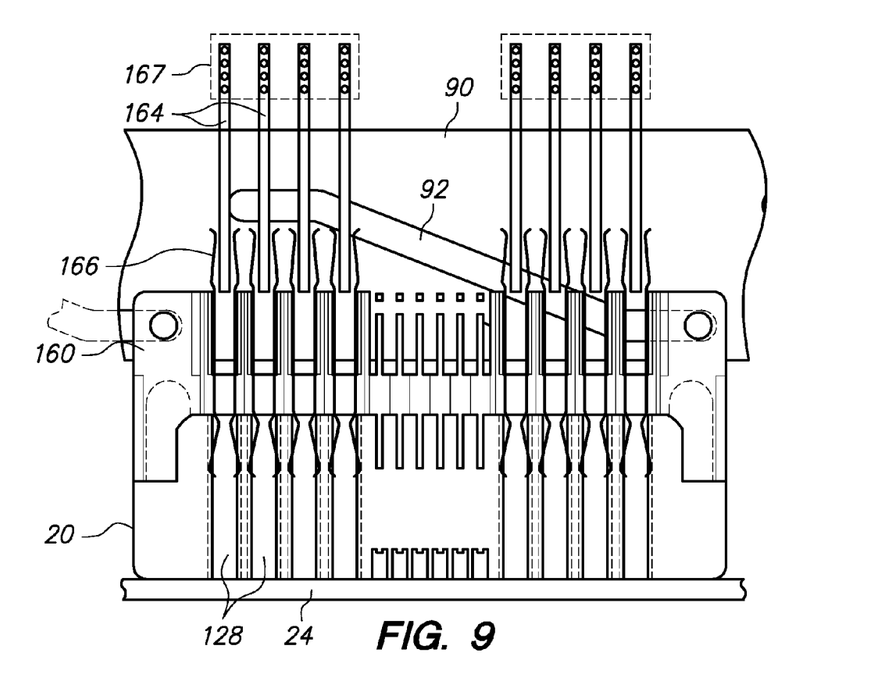
FIG. 9 is a cross-sectional view of the telescopic power connector, with the movable member connected with the fixed system power connector, as in FIG. 7.

FIGS. 8 and 9 illustrate further details of the telescopic connector of FIGS. 6 and 7. FIG. 8 is a cross-sectional view of the telescopic power connector with the movable member 160 separated from the fixed system power connector 20, as in FIG. 6. Further details of the fixed rails 164 are shown. The fixed rails 164 extend from a header 167. The movable member 160 carries a plurality of paired contacts 166 that ride along the fixed rails 164 and remain in sliding contact with the fixed rails 164 as the movable member 160 is moved up and down. Thus, the rails 164 in this embodiment may be referred to as the "internal fixed contacts" and the paired contacts 166 may be referred to as the "sliding contacts."

FIG. 9 is a cross-sectional view of the telescopic power connector, with the movable member 160 connected with the fixed system power connector 20, as in FIG. 7. As a result, the ends 165 of the paired terminals 166 are inserted into corresponding openings 127 of the fixed system power connector 20 and brought into contact with female terminals 128. As the movable member 160 is lowered from the position of FIG. 8 to the position of FIG. 9, the paired terminals 166 remain in sliding contact with the fixed rails 164, so that the electrical power is transferred through the telescoping power connector, from the header 167 along the rails 164, along the paired contacts 166, to the female terminals 128 in the fixed system power connector 20 on the motherboard 24. To disconnect the power supply from the motherboard 24, the slider plate 90 may be returned to its position in FIG. 8.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A power supply module, comprising:
    a power supply housing configured for removable insertion into a power supply bay of an electronic system;
    a telescopic power connector disposed within the power supply housing, the telescopic power connector including a plurality of internal fixed contacts in electrical communication with an electrical socket and a movable member carrying a plurality of elongate sliding contacts in sliding contact with the internal fixed contacts, the movable member being movable generally perpendicular to an insertion direction of the power supply housing; and
    a mechanical actuator configured for moving the movable member of the telescopic power connector into connection with a fixed system power connector, such that ends of the sliding contacts are moved into electrical connection with terminals on the fixed system power connector while remaining in sliding contact with the internal fixed contacts.

2. The power supply module of claim 1, wherein the mechanical actuator comprises a lever pivotably secured to the power supply housing and coupled to the movable member of the telescopic power connector for moving the movable member in response to pivoting the lever.

3. The power supply module of claim 1, wherein the mechanical actuator comprises:
    a slider plate slidably secured to the power supply housing and movable in a direction parallel to the insertion direction of the power supply housing, the slider plate including a pair of slots angled with respect to the insertion direction; and
    a pair of fasteners coupling the telescopic power connector to the slots of the slider plate, such that movement of the slider plate in one direction urges the movable member toward the fixed system power connector and linear movement of the slider pate in an opposing direction moves the movable member away from the fixed system power connector.

4. The power supply module of claim 1, further comprising:
    a fixed receptacle having a plurality of passageways each housing one of the plurality of internal fixed contacts, and wherein the sliding contacts comprise parallel rails each slidably disposed in one of the aligned passageways.

5. The power supply module of claim 1, further comprising:
    a header including a plurality of parallel, fixed rails, wherein the sliding contacts carried on the movable member comprise a pair of opposing contacts that slidably receive the fixed rails.

6. A computer system, comprising:
    a computer chassis including a power supply bay;
    a circuit board in the computer chassis, having a fixed system power connector secured to the circuit board adjacent to the power supply bay;
    a power supply module removably insertable in the power supply bay, the power supply module including a telescopic power connector including a plurality of internal fixed contacts in electrical communication with an electrical socket and a movable member carrying a plurality of elongate sliding contacts in sliding contact with the internal fixed contacts, the movable member being movable generally perpendicular to an insertion direction of the power supply module; and
    a mechanical actuator configured for moving the movable member of the telescopic power connector into connection with the external power connector, such that ends of the sliding contacts are moved into electrical connection with terminals on the external power connector while remaining in sliding contact with the internal fixed contacts.

7. The computer system of claim 6, wherein the power supply bay is positioned at the rear of the computer chassis.

8. The computer system of claim 6, further comprising a wall on the computer chassis between the circuit board and the power supply module, the wall including a window positioned such that the movable member of the telescopic power connector moves at least partially through the window to connect to the first power connector.

9. The computer system of claim 6, further comprising a lever pivotably secured to the power supply housing and coupled to the movable member of the telescopic power connector for moving the movable member in response to pivoting the lever.

10. The computer system of claim 6, further comprising:
a slider plate slidably secured to the power supply housing and movable in a direction parallel to the insertion direction of the power supply housing, the slider plate including a pair of slots angled with respect to the insertion direction; and
a pair of fasteners coupling the telescopic power connector to the slots of the slider plate, such that movement of the slider plate in one direction urges the movable member toward the fixed system power connector and linear movement of the slider pate in an opposing direction moves the movable member away from the fixed system power connector.

11. The computer system of claim 6, further comprising:
a fixed receptacle having a plurality of passageways each housing one of the plurality of internal fixed contacts, and wherein the sliding contacts comprise parallel rails each slidably disposed in one of the aligned passageways.

12. The computer system of claim 6, further comprising:
a header including a plurality of parallel, fixed rails, wherein the sliding contacts carried on the movable member comprise a pair of opposing contacts that slidably receive the fixed rails.

13. The computer system of claim 6, further comprising:
a first signal connector fixed with respect to the power supply module;
a flexible harness connected at one end to the first data signal connector and connected at the other end to a data-signal sub-connector of the telescopic power connector; and
a signal connector on the motherboard for receiving the data-signal sub-connector of the telescopic power connector when the telescopic power connector is connected to the fixed connector, for communicating data signals between the motherboard and the first signal connector.

14. The computer system of claim 6, wherein the circuit board is a motherboard or power board.

15. The computer system of claim 6, wherein the computer chassis is a rack-mountable server chassis.

* * * * *